(12) United States Patent
Nishii et al.

(10) Patent No.: US 6,984,436 B2
(45) Date of Patent: Jan. 10, 2006

(54) GRADED MATERIAL AND METHOD FOR SYNTHESIS THEREOF AND METHOD FOR PROCESSING THEREOF

(75) Inventors: Junji Nishii, Osaka (JP); Tadashi Koyama, Osaka (JP); Jun Yamaguchi, Osaka (JP)

(73) Assignees: National Institute of Advanced Industrial Science and Technology, Tokyo (JP); Nippon Sheet Glass Co., Ltd., Osaka (JP)

( * ) Notice: Subject to any disclaimer, the term of this patent is extended or adjusted under 35 U.S.C. 154(b) by 159 days.

(21) Appl. No.: 10/333,206

(22) PCT Filed: Jul. 16, 2001

(86) PCT No.: PCT/JP01/06138

§ 371 (c)(1),
(2), (4) Date: Jan. 17, 2003

(87) PCT Pub. No.: WO02/06560

PCT Pub. Date: Jan. 24, 2002

(65) Prior Publication Data

US 2005/0064197 A1   Mar. 24, 2005

(30) Foreign Application Priority Data

Jul. 18, 2000   (JP)   ............................. 2000-216824

(51) Int. Cl.
B32B 3/00   (2006.01)
C25F 3/00   (2006.01)
(52) U.S. Cl. ...................... 428/141; 428/212; 428/409; 216/2; 216/72; 216/74; 216/95
(58) Field of Classification Search ................ 428/410, 428/212, 426, 409, 543, 141; 216/37, 79, 216/97, 99, 109, 80, 2, 11, 72, 74, 95
See application file for complete search history.

(56) References Cited

U.S. PATENT DOCUMENTS 5,200,024 A * 4/1993 Blonder et al. ................ 216/24
5,357,165 A * 10/1994 Shibaoka et al. ........ 313/477 R
5,879,424 A * 3/1999 Nishii et al. .................... 65/31

FOREIGN PATENT DOCUMENTS

JP   63-131542   6/1988

(Continued)

OTHER PUBLICATIONS

K. Ishii et al.; Effects of Fluorine Addition on the Structure and Optical Properties of SiO2 Films formed by Plasma-Enhanced Chemical Vapor Deposition,; pp. 109-117.

(Continued)

*Primary Examiner*—Deborah Jones
*Assistant Examiner*—Gwendolyn Blackwell
(74) *Attorney, Agent, or Firm*—Whitham, Curtis & Christofferson, PC

(57) ABSTRACT

In homogeneous materials, etching characteristics depend on properties inherent in these materials regardless of whether they are isotropic or anisotropic, and there have been limitations in realizing various desired shapes. A subject for the invention is to provide a gradient material which eliminates these limitations.

A gradient material is provided in which the rate of etching with a specific chemical substance changes continuously or by steps from the outermost surface to an inner part thereof. This gradient material is made of a main material which contains an additive capable of changing the etching rate of the main material so that the concentration of the additive changes continuously or by steps. Especially when a glass material containing $SiO_2$ as the main component is used as the main material and fluorine is used as the additive, then a gradient material in which the rate of etching with an aqueous solution of hydrofluoric acid changes in the depth direction can be obtained.

3 Claims, 5 Drawing Sheets

FOREIGN PATENT DOCUMENTS

| | | |
|---|---|---|
| JP | 1-232744 | 9/1989 |
| JP | 5-18316 | 1/1993 |
| JP | 5-345977 | 12/1993 |
| JP | 8-231248 | 9/1996 |
| JP | WO 97/35813 | * 10/1997 |
| JP | 11-87310 | 3/1999 |
| JP | 11-123771 | 5/1999 |

OTHER PUBLICATIONS

N. Borrelli; Fabrication and Applications of Lens Arrays and Devices; Microoptics Technology; 1999; pp. 1-57.

* cited by examiner

GRADED MATERIAL AND METHOD FOR SYNTHESIS THEREOF AND METHOD FOR PROCESSING THEREOF

TECHNICAL FIELD

The present invention relates to a gradient material in which the etching rate changes in the depth direction, and to a method of synthesizing the same and a method of processing the same.

BACKGROUND OF THE INVENTION

Materials called gradient functional materials have hitherto been known and are being enthusiastically developed. For example, Japanese Patent Laid-Open No. 345977/1993 discloses a structure of the material and an apparatus for producing it, and "gradient functional material" is defined therein as "a material in which the internal compositional distribution changes continuously". Effects expected of such materials in which the compositional distribution changes continuously include the enhancement of heat resistance, and many developments have been achieved from this standpoint. In particular, in the field of space environment, such gradient functional materials are attracting attention as materials capable of withstanding extreme temperature changes.

On the other hand, in the field of electronics also, the effectiveness of a material whose compositional distribution changes with a gradient in the formation of an insulating layer is disclosed in Japanese Patent Laid-open No. 18316/1993.

In the field of optics also, gradient functional materials are receiving attention. Japanese Patent Laid-Open No. 231248/1996 discloses a technique in which a material whose refractive index changes with a gradient is formed as an antireflection film on a glass substrate or the like. An example proposed therein is a structure which comprises a glass substrate having a refractive index of about 1.5 and a thin film formed on a surface of the substrate. In this structure, the refractive index of the thin film is about 2.0 for a part thereof close to the substrate, gradually decreases with reducing distance to the uppermost surface of the film, and becomes about 1.55 at the uppermost surface.

The reference teaches that a glass surface which has a reflectance of about 4% when it has no thin film formed thereon can be made to have a reflectance of 1.5% or lower by forming such a thin film thereon. A technique heretofore in general use for realizing such an antireflection film is to alternately deposit a high-refractive-index material and a low-refractive-index material. The method disclosed therein is expected to be a technique which can more easily realize an antireflection function in a wide wavelength range.

As described above, gradient functional materials are materials which are attracting attention in many fields. With respect to applications, however, most of these fall under the category in which the property attributable to a gradient in compositional distribution is utilized.

On the other hand, the field of microprocessing technology also has achieved a remarkable development. In particular, semiconductor processing techniques have greatly progressed and made it possible to conduct processing on the order of 1 $\mu$m or less. The main technique is photolithography. The technology of microprocessing is extensively used not only for semiconductors but in the field of optics. In particular, lenses having a diameter of 1 mm or smaller, which are far smaller than the lenses heretofore in use, diffraction gratings having alternating ridges and grooves of about 1 $\mu$m, and the like are produced with techniques of microprocessing. The field in which such minute optical elements are dealt with is recently often called microoptics. General production processes and all optical elements obtained thereby are roughly explained in *Microoptics Technology*, written by N. F. Borrelli (published by Maecel Dekker, Inc. in 1999).

Examples of methods for producing optical elements include plastic molding, glass molding, and the like. Besides these, a combination of photolithography and the technique of reactive etching is frequently used in producing minute lenses, diffraction gratings, diffraction lenses, or the like. For obtaining particular optical properties by such a method, three-dimensional convexity (lens) or grooves (optical diffraction element) are necessary. A method of chemically etching (wet etching) a material in a solution, which is a technique most easily usable, is disclosed in Japanese Patent Laid-Open No. 123771/1999. In this method, a stamper for a microlense array is formed through etching. When this technique, which is for forming spherical concave parts, is used for etching an isotropic material such as a glass, a shape having spherical surfaces attributable to the isotropy of etching is obtained.

In the case of materials which are not isotropic in etching, such as crystals, a shape attributable to the symmetry of crystals can be realized through etching. Typical examples of anisotropic etching include the formation of a V-shaped groove using a single crystal of silicon. In this case, a groove is formed in a specific direction so as to have a shape having a specific angle, and this groove is utilized, e.g., as a fixing groove for optical fibers.

However, in those homogeneous materials shown as examples, etching characteristics depend on properties inherent in these materials regardless of whether they are isotropic or anisotropic, and there have been limitations in realizing various desired shapes. In the case of lenses, for example, formation of an aspheric lens is essentially impossible. In the case of diffraction gratings having V-shaped grooves, freedom of utilization can be secured by changing the angle of the grooves in a wide range. However, the etching, which depends on properties of the materials, only gives grooves which are limited in angle, and the freedom thereof is hence significantly limited.

An aim of the invention, which has been achieved in order to eliminate such problems, is to considerably relax limitations on the shapes obtained through etching, by using a gradient material.

DISCLOSURE OF THE INVENTION

The invention provides a gradient material wherein the rate of etching with a specific chemical substance changes continuously or by steps from the outermost surface to an inner part thereof. Such gradient material is made of a main material which contains an additive capable of changing the etching rate of the main material so that the concentration of the additive changes continuously or by steps.

Especially when a glass material containing $SiO_2$ as the main component is used as the main material and fluorine is used as the additive, then a gradient material in which the rate of etching with an aqueous solution of hydrofluoric acid changes in the depth direction can be obtained. This gradient material is synthesized by a method in which an $SiO_2$ film is deposited on a substrate and fluorine is mixed therewith while conducting the film deposition. In a specific method, a chemical vapor deposition process is used and the ratio of the flow rate of a fluorine source gas fed to the deposition chamber to the flow rate of an $SiO_2$ source gas fed thereto is changed with time, whereby the gradient material can be synthesized.

Features of the invention reside in that a glass, which in itself is an isotropic material, is used and is made to have an etching rate which changes with depth toward an inner part to thereby realize anisotropic etching. The features reside also in that the anisotropy is not one which has been determined beforehand as in single crystals but can be determined at will, and that a shape to be realized can be precisely controlled or a shape which has been unable to obtain can be realized through wet etching, a technique which has been well known.

Figure 1:
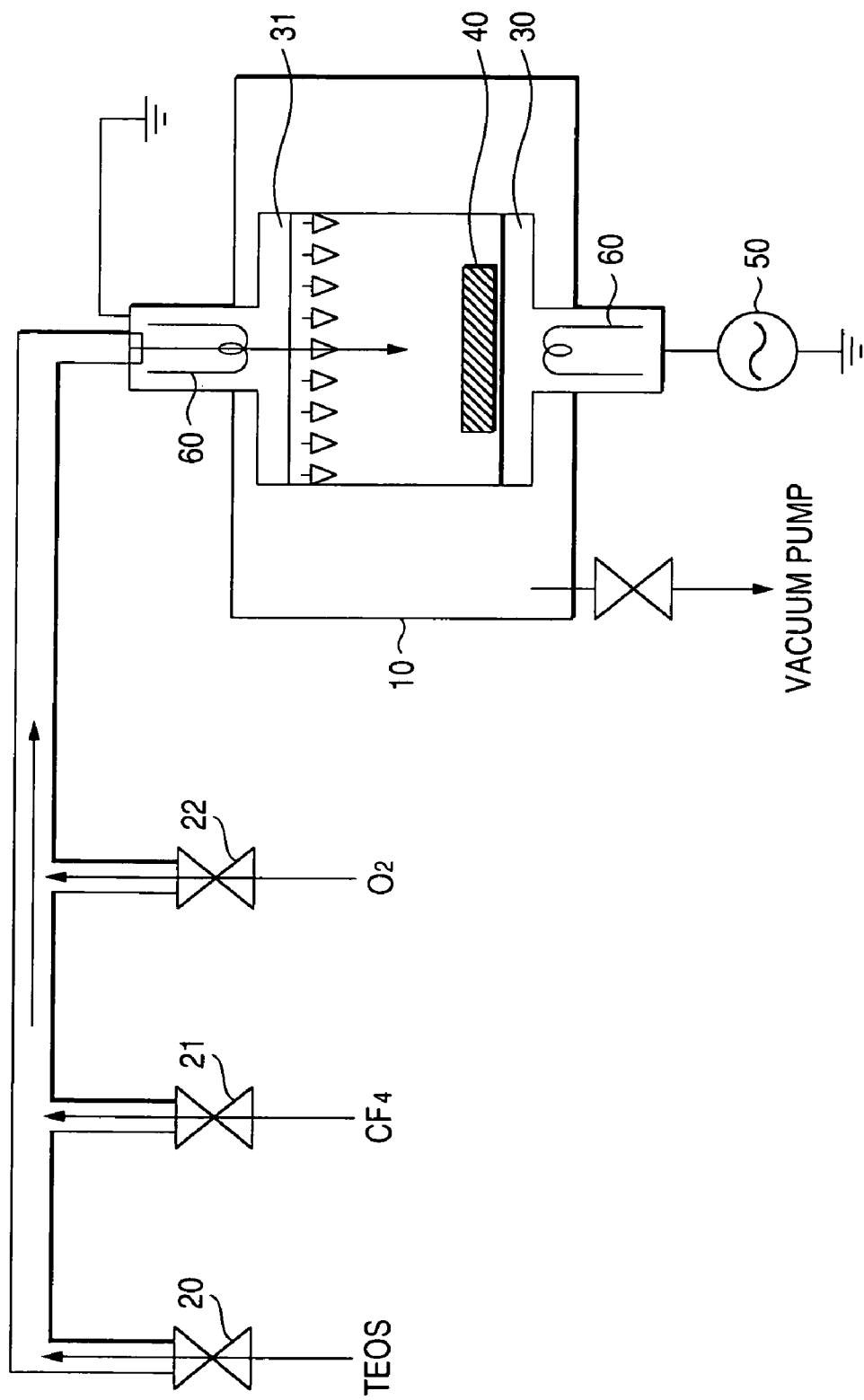
FIG. 1 is a diagrammatic view of a film deposition apparatus for a gradient material of the invention.

In the drawings, sign 10 denotes a reaction vessel, 20, 21, and 22 mass flow controllers, 30 and 31 electrodes, 40 and 42 substrates, 50 a radio frequency power source, 60 heaters, 80 a gradient material film, 82 a chromium film, and 84 a photoresist.

BEST MODE FOR CARRYING OUT THE INVENTION

Modes for carrying out the invention will be explained below.

In practicing the invention, the plasma-assisted chemical vapor deposition method (hereinafter abbreviated as PCVD method) was employed. The PCVD method is a technique which has been generally established and does not constitute the main part of the invention. This technique, however, is suitable for the synthesis of a material in which the etching rate changes with a gradient toward an inner part and which is intended to be attained by the invention. Other techniques such as, e.g., vapor deposition and sputtering can also be used for realizing the spirit of the invention.

A diagrammatic view of the PCVD apparatus used for the invention is shown in FIG. 1. The material to be mainly deposited is $SiO_2$, and the additive (dopant) for changing etching rate is fluorine (F). As a source of $SiO_2$ was used TEOS (tetraethoxysilane: $Si(OCH_2CH_3)_4$). As a source of fluorine was used carbon tetrafluoride ($CF_4$). Although liquid at ordinary temperature, TEOS can be made to have a necessary vapor pressure by heating. It was hence introduced in a vapor form into the reaction vessel 10. $CF_4$ was introduced as it was, because it is gaseous. Oxygen was mixed therewith and introduced in order to decompose the TEOS and obtain $SiO_2$. In introducing these feed gases, the flow rates of these were regulated respectively with the mass flow controllers 20, 21, and 22.

The reaction vessel 10 is equipped with parallel flat electrodes 30 and 31. One electrode 30 is capable of holding a substrate 40 to be placed thereon. The apparatus was designed to introduce the feed materials into the reaction vessel 10 through an opening formed around the other electrode 31 so that the feed materials are more easily converted into plasmas and in-plane homogeneity is enhanced. As the radiofrequency (RF) power to be supplied from a radiofrequency power source 50 to the electrodes was use done having a frequency of 13.4 MHz. The substrate temperature was regulated to about 400° C. by heating with a heater 60. According to the spirit of the invention, it is necessary to continuously change flow rates in film deposition. Because of this, the pressure in the reaction vessel 10 always fluctuates. For automatically correcting the internal pressure, the apparatus was designed to always feed found values of the pressure in the reaction vessel 10 back to the mass flow controllers 20, 21, and 22. Thus, a constant pressure and a stable film deposition state were maintained.

In film deposition, substrates are not particularly limited. However, a single-crystal silicon wafer, glass substrate, or the like was used.

EXAMPLES

Example 1

The PCVD apparatus was used to successively form an $SiO_2$ film and a film containing fluorine. These films were compared in etching rate. In the film deposition, the basic conditions were a TEOS flow rate of 7 sccm, $O_2$ flow rate of 233 sccm, RF power of 250 W, and substrate temperature of 400° C. $CF_4$ was not fed until a given thickness was reached, and the $CF_4$ flow rate was thereafter changed by steps up to 50 sccm. Namely, $SiO_2$ only was deposited in the initial stage to form a film having a thickness of about 2 µm, and $CF_4$ was thereafter mixed at a rate of 50 sccm to conduct deposition. Thus, a film having a thickness of about 4.5 µm was obtained. During this film deposition, the pressure was kept constant at 53.3 Pa. The rate of film deposition was 54 nm/min in the case of $SiO_2$ alone, and was 41 nm/min in the case where $CF_4$ was mixed at a rate of 50 sccm.

The film obtained was etched to examine the etching rate distribution in the film thickness direction. For the etching was used a 5% aqueous solution of hydrofluoric acid. The sample to be subjected to the etching was one which had an area having no film and an area having the film, and which had been produced by conducting the film deposition on a substrate to which a mask had been applied beforehand. As the substrate was used a single-crystal silicon wafer. Etching was conducted for a given time period, and the difference in level between the film and the area having no film was measured with a tracer type level difference meter to determine the thickness of the film which had undergone the etching. Since silicon is not attacked by hydrofluoric acid, the level of the masked area was taken as a standard level.

Figure 2:
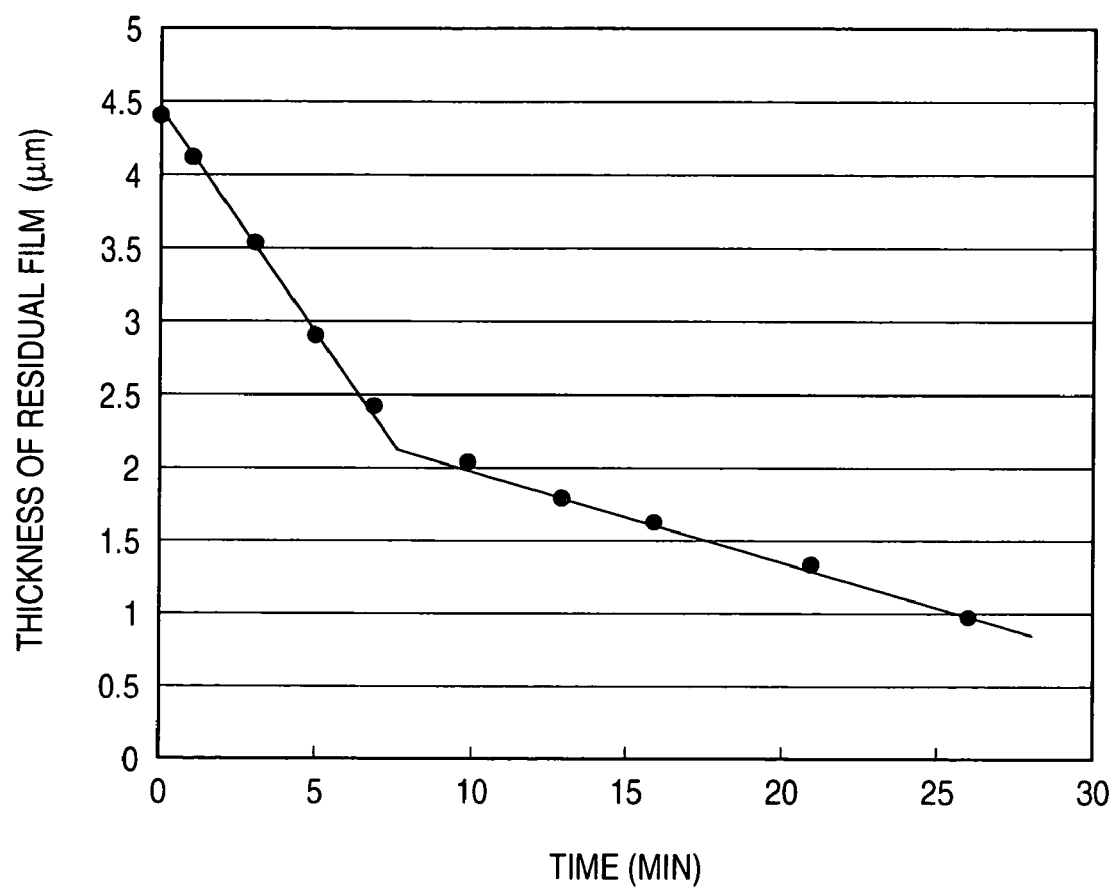
FIG. 2 is a presentation showing the relationship between etching time and residual-film thickness in an Example.

In FIG. 2 is shown the change in film thickness with etching time. In parts close to the surface which were etched in a short etching time, the etching rate was 250 nm/min. As the etching proceeded to inner parts, however, the etching rate decreased to 62 nm/min. A material in which parts close to the surface distinctly differed from inner parts in etching rate was obtained.

Example 2

The same apparatus as in Example 1 was used to conduct film deposition. Although a material in which the etching rate changed by steps was obtained in Example 1, a material in which the etching rate changed continuously was produced in this Example. In the film deposition, the basic conditions were a TEOS flow rate of 7 sccm, $O_2$ flow rate of 233 sccm, RF power of 250 W, and substrate temperature of 400° C. The flow rate of $CF_4$ was continuously changed in such a manner that it was 0 sccm at the initiation of the film deposition and became 50 sccm at the termination of the film deposition. Thus, a film about 6 μm thick was obtained.

Figure 3:
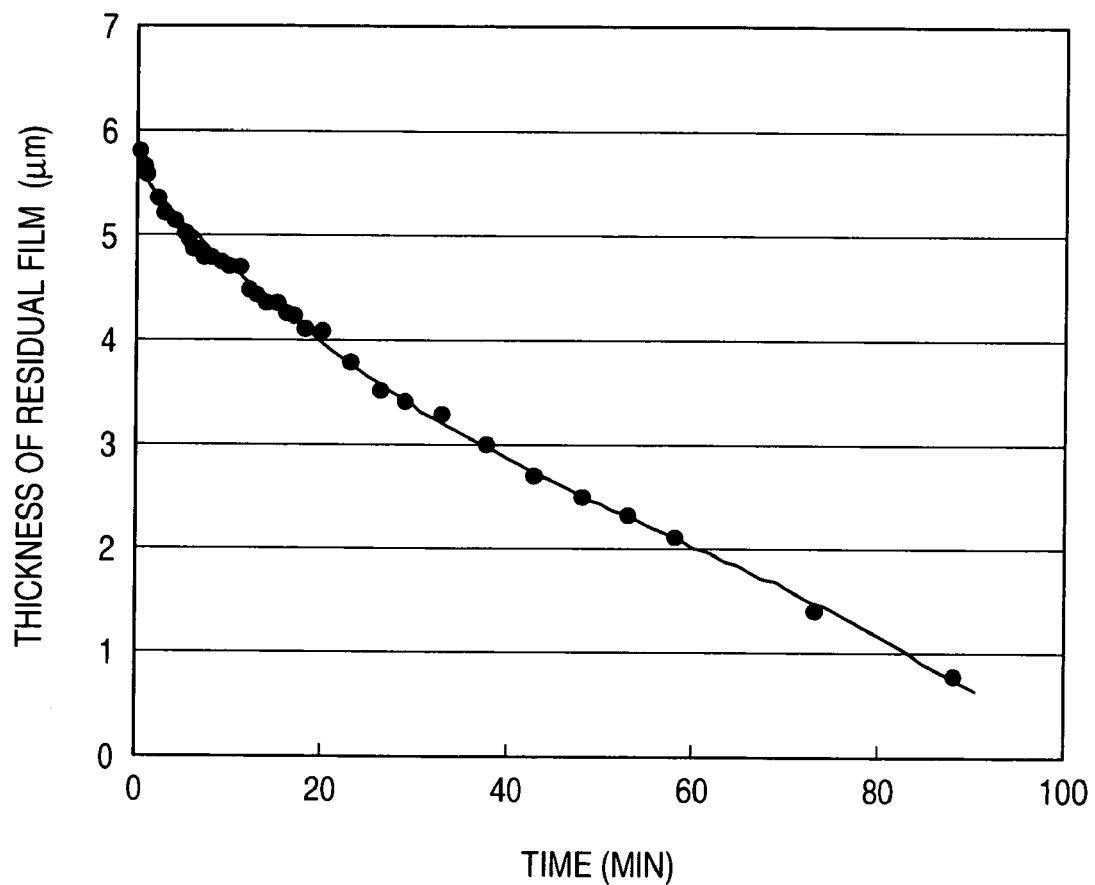
FIG. 3 is a presentation showing the relationship between etching time and residual-film thickness in another Example.

This film was examined in the same manner as in Example 1 to determine the relationship between etching depth and etching time. The results thereof are shown in FIG. 3. In case where the etching rate is constant even in inner parts of the film, the line is straight. However, the line obtained was clearly curved, showing that the etching rate changed with a gradient. It was thus found that a material in which the etching rate changes with a gradient is obtained.

Example 3

Figure 4:
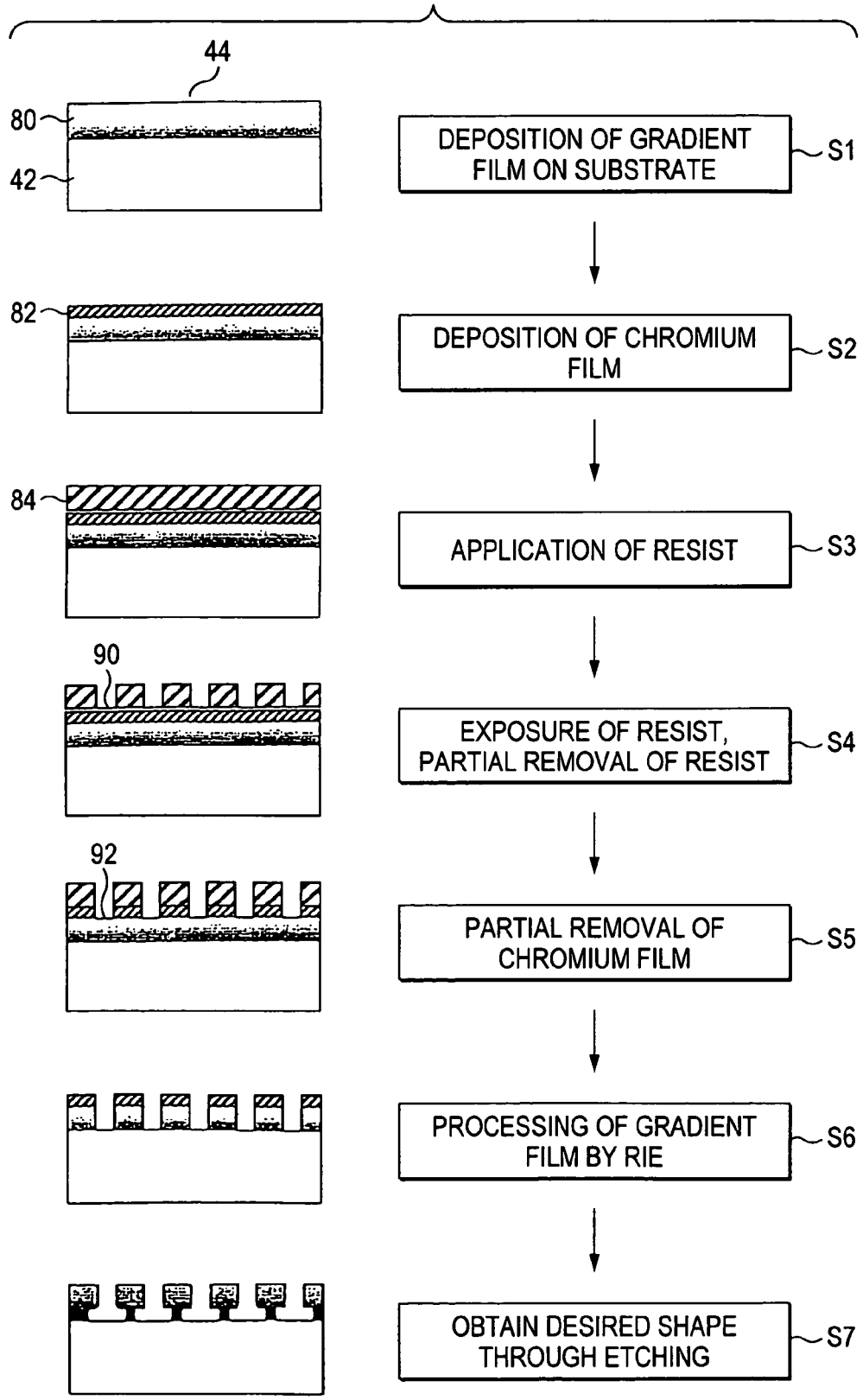
FIG. 4 is a flowchart of a method for processing a gradient material of the invention.

In this Example, a method of processing is shown. In FIG. 4 is given a flowchart of steps from production of a gradient material to processing thereof. Although the film constitution was step-wise as in Example 1, the film in an initial stage of film deposition was doped with fluorine and a film consisting only of $SiO_2$ was formed in the latter half of the film deposition. Namely, a gradient material was produced in which the etching rate was high in parts close to the substrate 42 and was lower as compared therewith in parts close to the surface 44. A chromium metal film 82 was deposited by sputtering on the surface of the gradient material film 80, which had such properties. A photoresist 84 was further applied. Thereafter, the photoresist 84 was exposed with a laser illuminator to thereby form a lattice pattern 90 in the photoresist 84. Furthermore, this resist was used as a mask to etch the chromium film 82 to expose those parts of the film surface which corresponded to the lattice pattern. This film was etched by means of a reactive ion etching (=RIE) apparatus to further dig the openings 92. The gradient material film 80 in this state was etched with fluorine. Finally, the chromium film 82 was removed.

Figure 5:
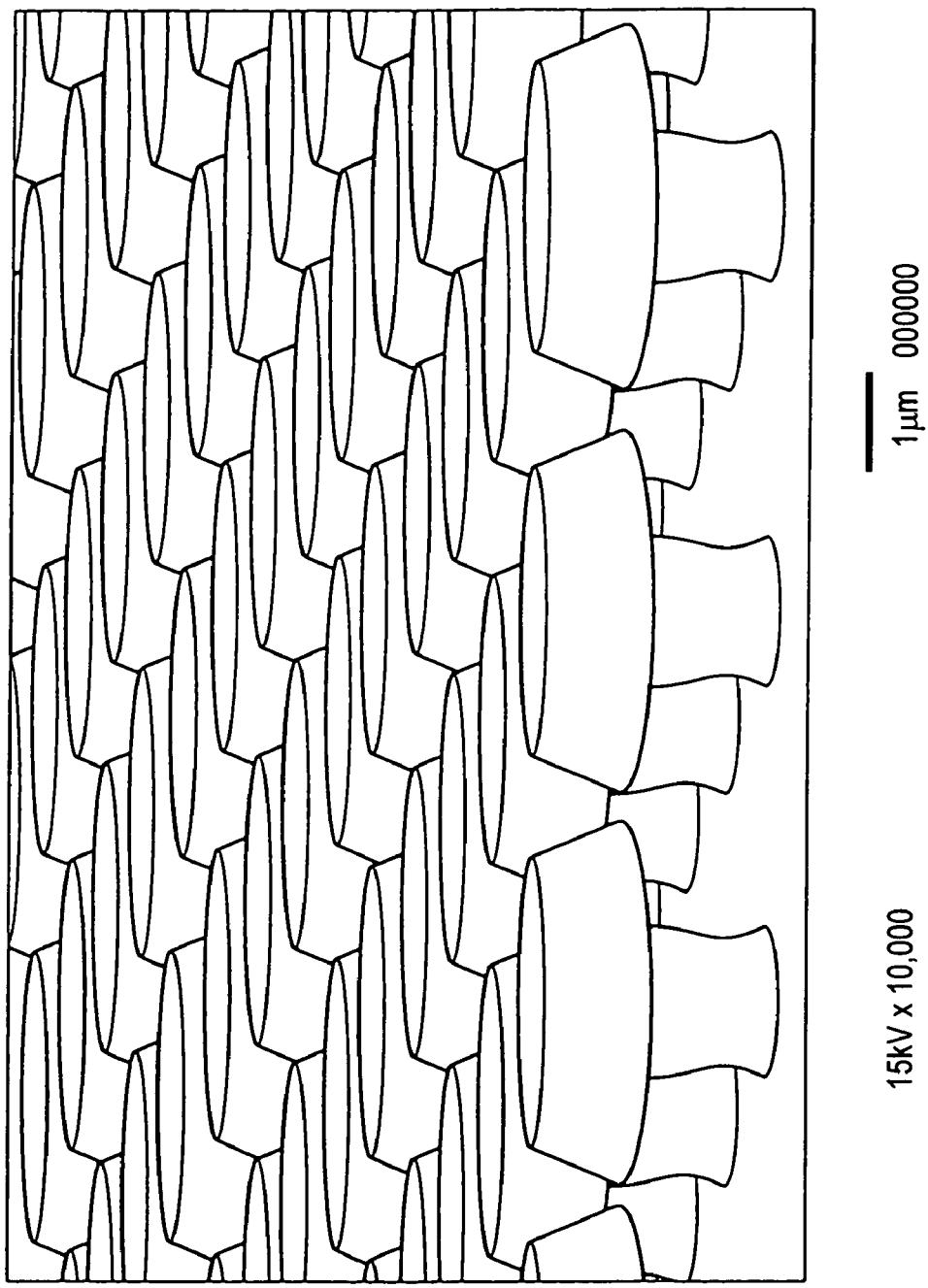
FIG. 5 is a view reproduced from an electron photomicrograph showing an Example for the method of processing a gradient material of the invention.

In FIG. 5 is given a view reproduced from a scanning electron microscope (SEM) photograph of the structure obtained. A three-dimensional shape having umbrellas on top could be produced. This shape was formed because the upper parts had a lower etching rate and the lower parts had a higher etching rate. Although the structure shown above is an extreme case, it can be seen that any desired side geometry can be obtained by changing the manner of doping.

In the Examples, thicknesses were limited to a range up to several micrometers. However, the thicknesses are not an essential matter and the invention is applicable also to thick films.

INDUSTRIAL APPLICABILITY

According to the invention, a material from which a three-dimensional shape can be formed at will through wet etching can be easily obtained. Namely, by creating a gradient material in which the etching rate changes in the direction of the depth of the material according to the spirit of the invention, the shape to be formed by processing can be controlled beyond the range for the isotropic materials and crystalline materials heretofore in use.

What is claimed is:

1. A gradient material characterized in that the rate of etching with a specific chemical substance changes continuously or by steps from the outermost surface to an inner part thereof; wherein the gradient material is in a form of a film on a substrate, and wherein a chromium film has been deposited on the gradient material.

2. A gradient material characterized in that the rate of etching with a specific chemical substance changes continuously or by steps from the outermost surface to an inner part thereof; wherein the gradient material is in a form of a film on a substrate, and the concentration of at least one additive added to a main material changes continuously or by steps from the outermost surface to an inner part of the main material, and wherein the additive in the gradient material corresponds to a three-dimensional shape being etched therefrom.

3. The gradient material of claim 2, wherein the three-dimensional shape is an umbrella shape.

* * * * *